United States Patent
Ramey et al.

(10) Patent No.: US 9,332,863 B2
(45) Date of Patent: May 10, 2016

(54) CONTAINMENT APPARATUS WITH MOVABLE DOOR

(71) Applicant: Panduit Corp., Tinley Park, IL (US)

(72) Inventors: Samuel C. Ramey, Naperville, IL (US); Samuel M. Marrs, Bradley, IL (US); Muhammad Z. Feroz, Chicago, IL (US); Darren J. Reigle, Frankfort, IL (US)

(73) Assignee: Panduit Corp., Tinley Park, IL (US)

( * ) Notice: Subject to any disclaimer, the term of this patent is extended or adjusted under 35 U.S.C. 154(b) by 232 days.

(21) Appl. No.: 14/206,507

(22) Filed: Mar. 12, 2014

(65) Prior Publication Data

US 2014/0263132 A1 Sep. 18, 2014

Related U.S. Application Data

(60) Provisional application No. 61/789,583, filed on Mar. 15, 2013.

(51) Int. Cl.
*E04H 1/00* (2006.01)
*A47F 5/00* (2006.01)
*E05D 7/00* (2006.01)
*H05K 7/20* (2006.01)

(52) U.S. Cl.
CPC ............... *A47F 5/0006* (2013.01); *A47F 5/00* (2013.01); *E04H 1/00* (2013.01); *E05D 7/00* (2013.01); *H05K 7/20745* (2013.01); *Y10T 16/538* (2015.01)

(58) Field of Classification Search
CPC ..... E04B 1/34384; E04B 1/3431; E04H 1/00; E04H 1/12; E04H 2005/005
See application file for complete search history.

(56) References Cited

U.S. PATENT DOCUMENTS

| | | | | |
|---|---|---|---|---|
| 3,298,143 A | * | 1/1967 | Rogers | E04B 2/827 160/202 |
| 4,692,838 A | | 9/1987 | Merchant | |
| 4,943,110 A | * | 7/1990 | Pastva | B60J 5/065 16/104 |
| 5,341,944 A | | 8/1994 | Latino | |
| 6,257,638 B1 | * | 7/2001 | Graber | B60P 3/34 296/26.01 |
| 6,806,422 B1 | | 10/2004 | Rivers et al. | |

(Continued)

FOREIGN PATENT DOCUMENTS

| | | | | |
|---|---|---|---|---|
| CN | 201869453 U | | 6/2011 | |
| DE | 202013100519 U1 | * | 2/2013 | ......... H05K 7/20745 |

(Continued)

OTHER PUBLICATIONS

PolarPlex™ P2 Sliding Door manufactured by NER Data Corporation, http://www.nerdata.com/Documents/TS/Polargy/NER_Polargy_PolarPlex_P2Sliding_Doors.pdf; 1 page, undated.

*Primary Examiner* — Christine T Cajilig
(74) *Attorney, Agent, or Firm* — Christopher S. Clancy; Aimee E. McVady

(57) ABSTRACT

An aisle containment apparatus having a pair of spaced apart upper rails and a pair of spaced apart lower rails positioned spaced apart from and below the pair of upper rails. A side blanking panel is secured to one of the pair of upper rails and to one of the pair of lower rails and a ceiling spans between the pair of upper rails. A fixed panel is secured to the pair of upper rails and to the pair of lower rails and a moveable panel is releasably secured to the pair of upper rails and is adjustably positioned along the pair of upper rails so as to position the moveable panel a predetermined distance from the first panel.

17 Claims, 12 Drawing Sheets

(56) References Cited

U.S. PATENT DOCUMENTS

| | | | |
|---|---|---|---|
| 7,128,120 | B2 | 10/2006 | Orbeck et al. |
| 7,418,802 | B2 | 9/2008 | Sarine et al. |
| 7,539,013 | B2 | 5/2009 | Brandon et al. |
| 7,644,543 | B2 * | 1/2010 | Amidon, II ............... E04H 3/08 52/106 |
| 7,712,813 | B2 * | 5/2010 | Di Franco ............ B62D 63/061 296/171 |
| 7,746,634 | B2 | 6/2010 | Hom et al. |
| 7,841,199 | B2 | 11/2010 | VanGilder et al. |
| 7,944,692 | B2 | 5/2011 | Grantham et al. |
| 7,986,526 | B1 | 7/2011 | Howard et al. |
| 8,270,161 | B2 | 9/2012 | Archibald et al. |
| 8,628,154 | B2 | 1/2014 | Caveney et al. |
| 8,701,356 | B2 * | 4/2014 | Forsland ............ E04B 1/34305 4/494 |
| 2004/0074046 | A1 | 4/2004 | Mimnaugh |
| 2008/0121349 | A1 * | 5/2008 | De La Cruz ............ B60J 11/02 160/23.1 |
| 2009/0229194 | A1 | 9/2009 | Armillas |
| 2009/0236052 | A1 * | 9/2009 | Beggs ..................... E06B 9/13 160/265 |
| 2010/0061057 | A1 | 3/2010 | Dersch et al. |
| 2010/0144265 | A1 | 6/2010 | Bednarcik et al. |
| 2011/0036509 | A1 * | 2/2011 | Goodman ............... E06B 5/164 160/7 |
| 2011/0108207 | A1 * | 5/2011 | Mainers ............ H05K 7/20745 160/87 |
| 2011/0226505 | A1 | 9/2011 | Mackin |
| 2011/0271610 | A1 * | 11/2011 | Cottuli ............... H05K 7/20745 52/173.1 |
| 2012/0112612 | A1 | 5/2012 | Krietzman |
| 2012/0227914 | A1 | 9/2012 | Coleman |
| 2012/0298335 | A1 | 11/2012 | Eckberg et al. |
| 2013/0149954 | A1 | 6/2013 | North et al. |
| 2013/0160271 | A1 * | 6/2013 | Krietzman ............ H05K 13/04 29/428 |
| 2013/0165035 | A1 | 6/2013 | Krietzman et al. |
| 2014/0059946 | A1 * | 3/2014 | Gardner ............ E04B 1/34384 52/64 |
| 2015/0204137 | A1 * | 7/2015 | Montanaro ............... E06B 9/52 160/84.02 |

FOREIGN PATENT DOCUMENTS

| | | | | |
|---|---|---|---|---|
| DE | 202014003840 | U1 * | 6/2014 | ............ E04H 1/12 |
| EP | 2364075 | A1 | 9/2011 | |
| ES | EP 2101017 | A2 * | 9/2009 | ......... E04H 1/1205 |
| WO | 2010105618 | A1 | 9/2010 | |
| WO | 2011057297 | A1 | 5/2011 | |

* cited by examiner

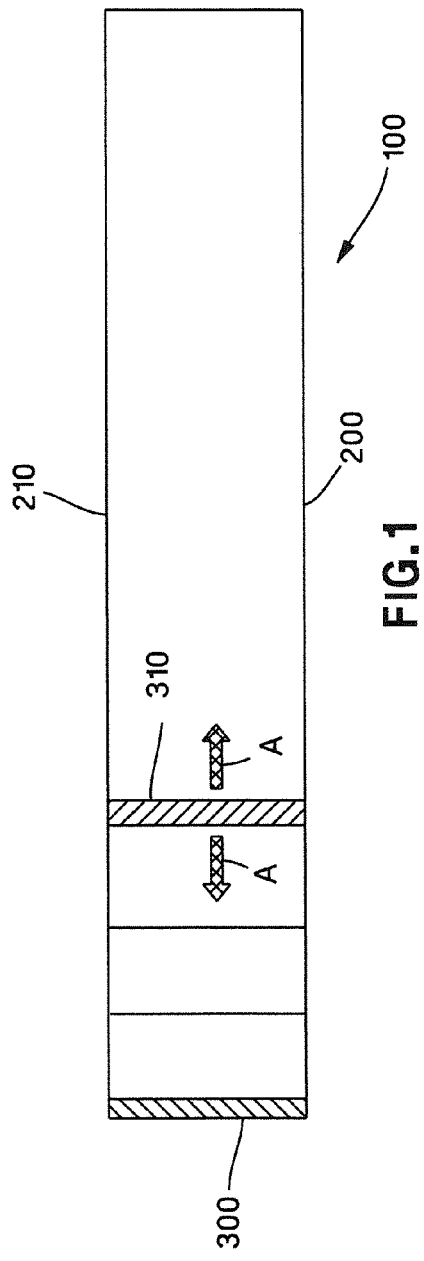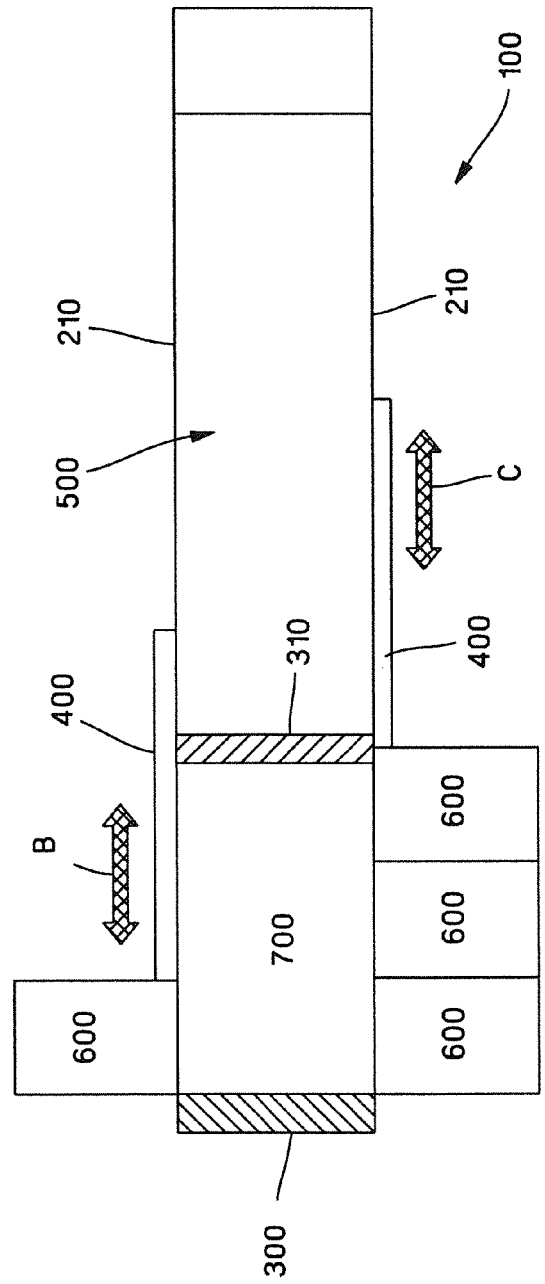

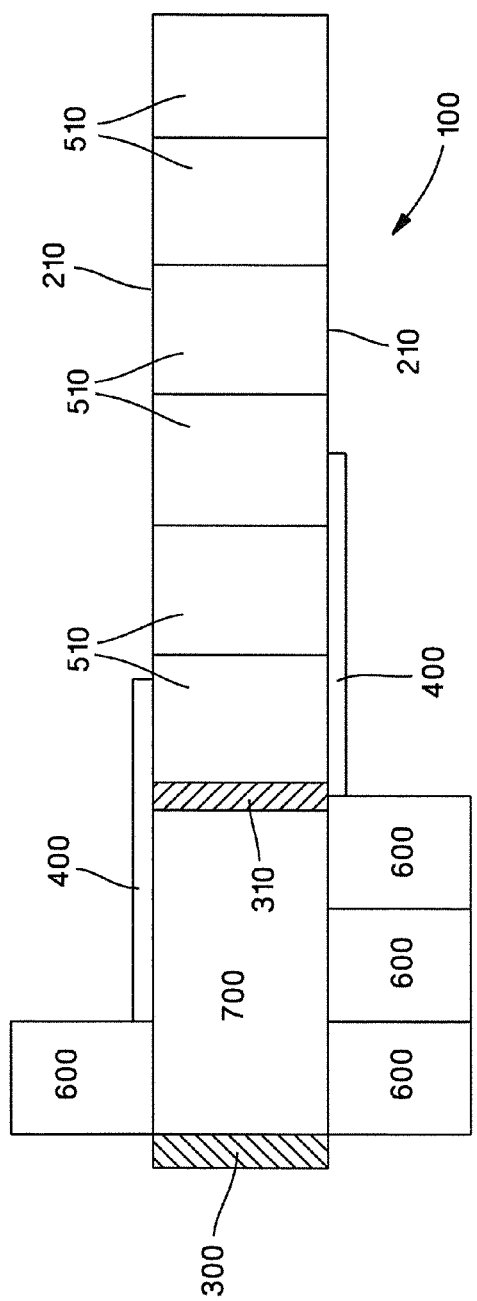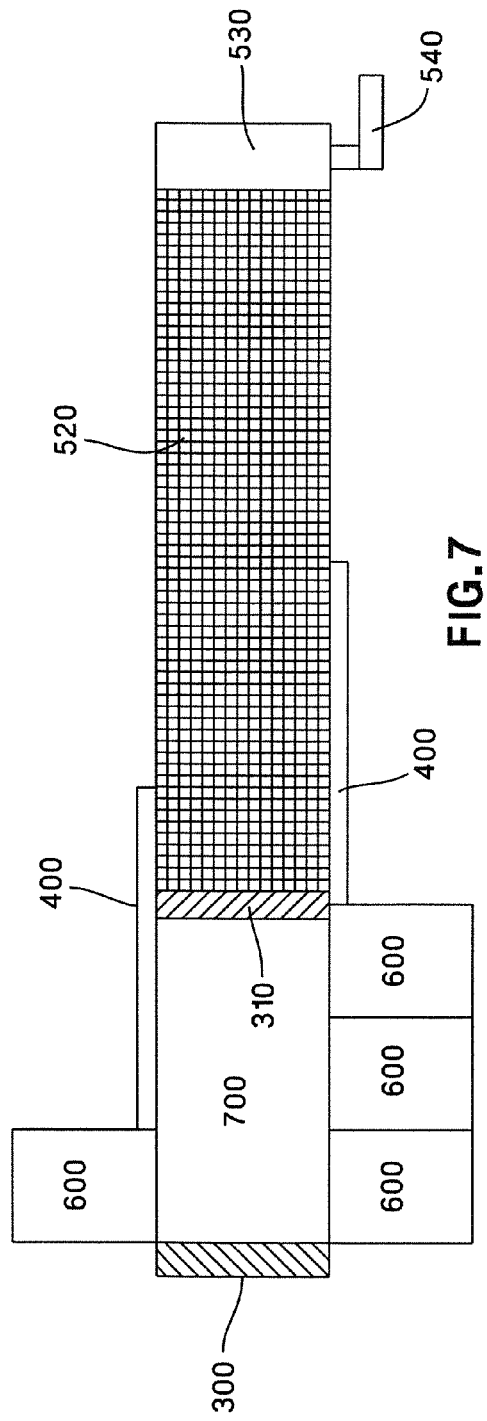

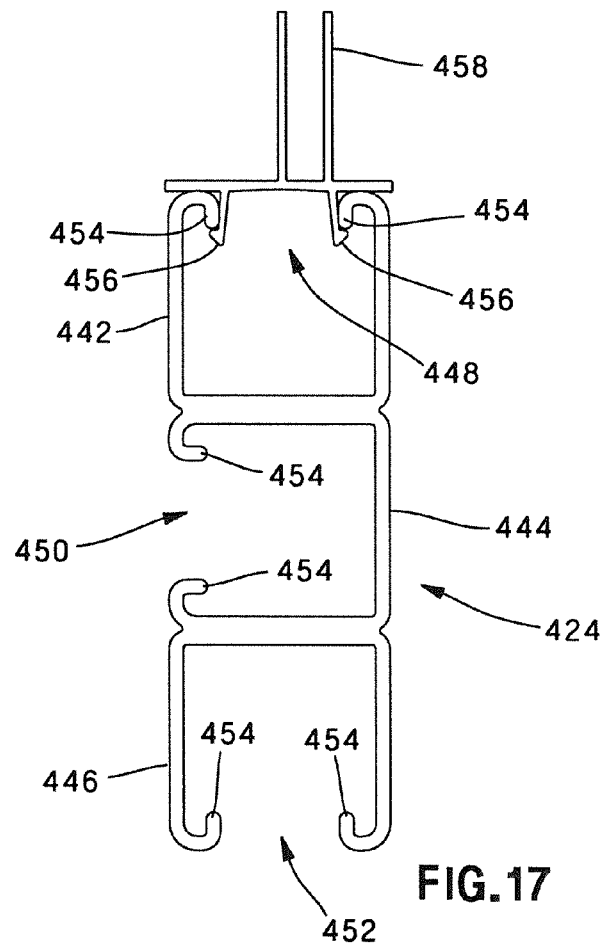
FIG. 17
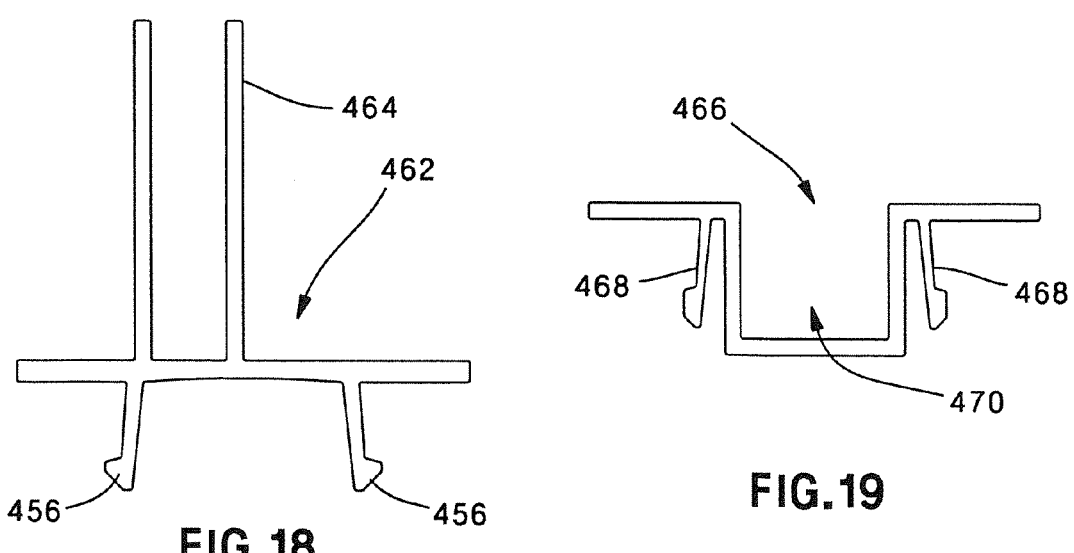
FIG. 18
FIG. 19

CONTAINMENT APPARATUS WITH MOVABLE DOOR

CROSS-REFERENCE TO RELATED APPLICATIONS

This application claims priority to U.S. Provisional Application No. 61/789,583, filed on Mar. 15, 2013, the subject matter of which is hereby incorporated be reference in its entirety.

FIELD OF THE INVENTION

The present invention generally relates to a containment apparatus, and, more specifically, to a hot aisle/cold aisle containment apparatus.

BACKGROUND

Current containment apparatus designs have a structure that has doors fixedly mounted at each end of the containment apparatus, with blanking panels mounted in between the doors to cover spaces that are not filled with racks/cabinets. As racks/cabinets are added, blanking panels must then be removed and stored or discarded. In addition, workers installing or maintaining the racks/cabinets may have to walk further to service racks/cabinets located on the inside of the containment apparatus. These issues can prove costly for the customer.

SUMMARY

In one example, an aisle containment apparatus includes a pair of spaced apart upper rails and a pair of spaced apart lower rails positioned spaced apart from and below the pair of upper rails. A side blanking panel is secured to one of the pair of the upper rails and to one of the pair of lower rails and a ceiling spans between the pair of upper rails. A fixed panel is secured to the pair of upper rails and to the pair of lower rails and a moveable panel is releasably secured to the pair of upper rails and is adjustably positioned along the pair of upper rails so as to position the moveable panel a predetermined distance from the first panel.

BRIEF DESCRIPTION OF THE DRAWINGS

FIG. 1 is a side view of an example of an adjustable containment apparatus with cabinets installed and side blanking panels removed for simplicity;

FIG. 2 is a top view of the adjustable containment apparatus of FIG. 1 with the blanking panels shown;

FIG. 6 is a top view of the adjustable containment apparatus of FIG. 2 with individual ceiling blanking panels installed;

FIG. 7 is a top view of the adjustable containment apparatus of FIG. 2 with a rolled flexible material ceiling installed;

FIG. 17 is a front elevation view of a triple strut with a channel bracket secured thereto;

FIG. 18 is a front elevation view of the channel bracket of FIG. 17; and

FIG. 19 is another embodiment of the channel bracket shown in FIG. 17.

DETAILED DESCRIPTION

Figure 11:
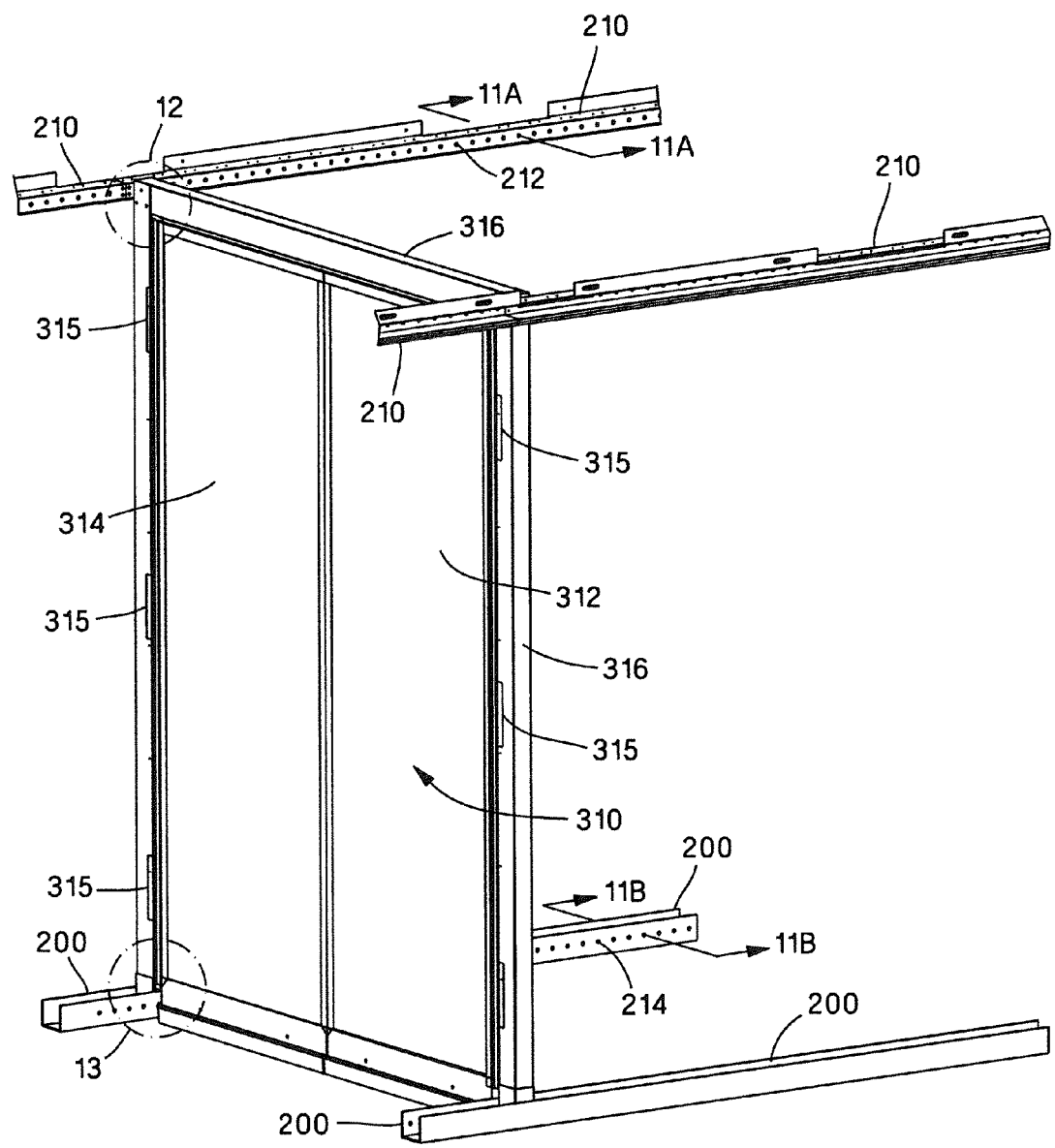
FIG. 11 is a perspective view of an example of a moveable panel of the containment apparatus.

Referring to FIGS. 1, 2, 11-11B and 14, one example of an adjustable containment apparatus 100 contains a pair of spaced apart parallel lower tracks or rails 200 and a pair of spaced apart parallel upper tracks or rails 210, with the pair of lower rails 200 positioned spaced apart from and below the pair of upper rails 210. Side blanking panels 400 are secured to a rail of the pair of upper rails 210 and a rail of the pair of lower rails 200, as will be discussed in more detail herein. The apparatus 100 further includes a ceiling 500, which spans the pair of upper rails 210 and is associated with the pair of upper rails 210, as will also be discussed in more detail herein. Additionally, apparatus 100 also includes a fixed panel 300, which in one embodiment is a fixed door 300, secured to the pair of upper rails 210 and the pair of lower rails 200, as seen for example in FIG. 14. Apparatus 100 further includes a moveable panel 310, which in one embodiment is also a moveable door 310, as seen in FIG. 11. As shown in FIG. 1, moveable door 310 can be positioned along upper rails 210, as shown by arrows A. Moveable door 310 can be positioned to define containment area 700, along with door 300, cabinets 600, and side blanking panels 400, as seen in FIG. 2.

The example apparatus 100 shown in FIG. 2 can eliminate all but one side blanking panel 400 per side of the containment apparatus 100, or even eliminate all side blanking panels 400 except for a single blanking panel 400 on one side of the containment apparatus 100. As seen in FIG. 2 blanking panel 400 is positioned, along a line indicated by arrow B, to enclose one side of containment area 700 of containment apparatus 100 where there is a smaller number of cabinets installed, which makes the containment apparatus 100 more flexible to growth or contraction than many current containment apparatus. As can be seen in FIG. 2, containment apparatus 100 can provide the ability to blank out the sides or enclose the containment apparatus 100 only in the area of the containment area 700 leaving the remaining section of the containment apparatus 100 open, except at the ceiling 500.

The floor, ceiling, fixed door 300, moveable door 310, cabinets 600, and side blanking panels 400 form the containment area 700, which can be used to receive heated air from cabinets 600 and direct the heated air into a ceiling or other plenum for return to an air conditioner or other air cooling unit. The containment apparatus 100 prevents heated air from the containment area 700 from re-circulating back towards the front of cabinets 600 and mixing with the cool air that is provided to and taken in from the front of cabinets 600 to cool equipment in cabinets 600.

Lower tracks or rails 200 are typically secured to a floor of a data center or other area, as seen in FIG. 11, and can be used for various purposes. For example, moveable door 310 can be mounted to lower tracks 200 such that the door 310 rides along lower tracks 200. Side blanking panels 400 can also be mounted to lower tracks 200 such that they are fixed or ride along lower tracks or rails 200. Lower tracks 200 can also be used to provide an air tight seal against racks/cabinets 600.

Upper tracks 210, as also seen in FIG. 11, are mounted to a ceiling or drop ceiling of a data center or other area, or are hung from the ceiling by threaded rods or other means, and can also be used for various purposes. For example, moveable door 310 and fixed door 300 can be mounted to upper tracks 210 such that the door 310 rides along upper tracks 210. Side blanking panels 400 can also be mounted to upper tracks 210 such that they are fixed or such that they ride along upper tracks 210. The upper tracks 210 can be used to provide an air tight seal against racks/cabinets 600. In addition, upper tracks 210 form a portion of the frame that is used to define ceiling portion 500 and to mount various types of ceiling coverings, such as ceiling blanking panels 510 or a flexible material 520, as discussed in more detail below.

Additionally, an alternative containment apparatus 100 may include two moveable doors 310, instead of a fixed door 300, that would be mounted to the lower tracks 200 and the upper tracks 210 such that the doors 310 ride along the lower tracks 200 and the upper tracks 210.

Door 300 will typically be a fixed type door, as will be described in more detail below, which is well known to those of skill in the art, but can also be a movable door, such as that described for moveable door 310, which will also be described in more detail below. Door 300 provides access to the containment area 700 while providing a seal to prevent the heated air from escaping the containment area 700 and defines one end of the containment area 700.

Moveable door 310 has much of the same structure as a fixed type door, which is well known to those of skill in the art, except that it is mounted such that it is movable along lower tracks 200 and/or upper tracks 210. Moveable door 310 can be mounted to the lower tracks 200 and/or upper tracks 210 such that moveable door 310 can be moved longitudinally along the tracks or rails (see arrow A in FIG. 1) to adjust the size of the containment area 700. Moveable door 310 can be mounted to lower tracks or rails 200 and/or upper tracks 210 in a variety of well know ways, such as by rollers, slides, etc., as long as moveable door 310 can be moved along lower tracks 200 and/or upper tracks 210. Moveable door 310 also provides access to the containment area 700, opposite from fixed door 300, while providing a seal to prevent the heated air from escaping the containment area 700 and defines the other end of the containment area 700. Movable door 310 allows the door to be placed anywhere along the containment apparatus 100 length, to a predetermined distance from fixed door 300 so as to decrease the distance from cabinets 600 to moveable door 310, which can eliminate the need for multiple side blanking panels 400 on each side of the containment system 100.

Side blanking panels 400 can be standard blanking panels 400 that are secured directly to lower tracks or rails 200 and upper tracks or rails 210 to partially define the sides of containment area 700 and provide a seal to prevent the heated air from escaping from the side of the containment area 700 between the cabinets 600 and moveable door 310, as seen in FIG. 2. In the example shown, side blanking panels 400 are mounted to the lower tracks or rails 200 and/or upper tracks or rails 210 such that the side blanking panels 400 can be moved longitudinally along the tracks (see arrows B and C in FIG. 2) and into the desired position. Alternatively, side blanking panels 400 can be inserted into a channel 209 defined within the pair of upper rails 210 and a channel 211 defined within pair of lower rails 200. With side panels 400 positioned within these channels 209, 211 rollers may be secured to the bottom of side blanking panels 400 to permit them to ride along within channels 209, 211.

Figure 3:
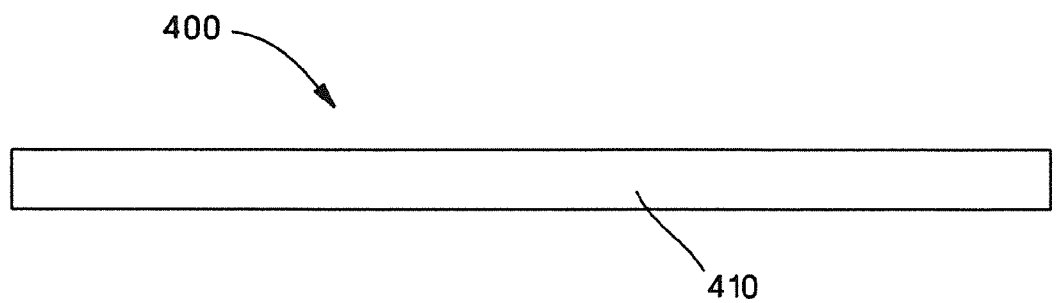
FIG. 3 is a top view of an example of a fixed width side blanking panel.
Figure 4:
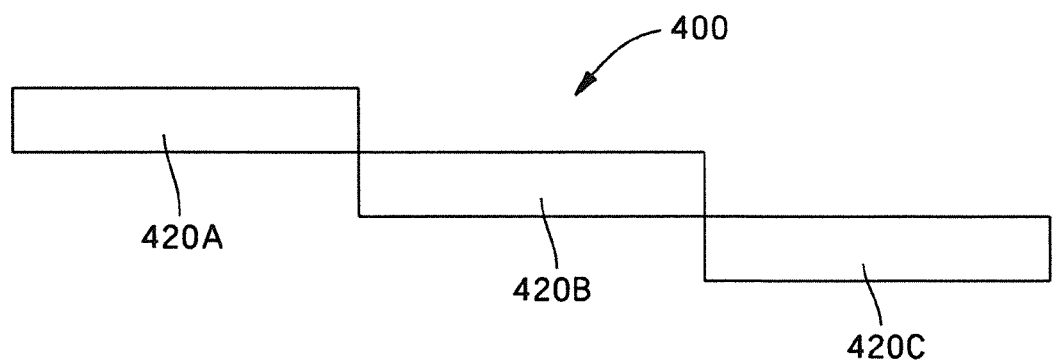
FIG. 4 is a top view of an example of a side blanking panel having telescoping panels.
Figure 5:
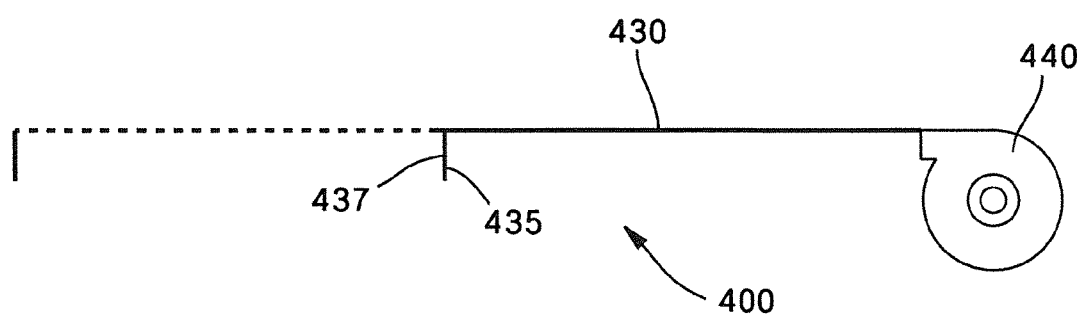
FIG. 5 is a top view of an example of a side blanking panel having a flexible material and a roller.

Referring to FIGS. 3-5, side blanking panels 400 can have various different structures. For example, side blanking panels 400 can be typical fixed width panels 410, as shown in FIG. 3. Alternatively, side blanking panels 400 can have multiple telescoping panels 420A-C, as shown in FIG. 4. These panels 420A-C can be positioned to be out of alignment with one another. At least two panels, and in this example, three panels, can be moveably secured to an upper rail 210 and to a lower rail 200 by being placed within channel 209 of an upper rail 210 and within channel 211 of a lower rail 200. Panels 420A-C, when placed within channels 209 and 211, will be able to be telescoped and each panel may be able to move independent of the other panels within channels 209 and 211 and along containment apparatus 100. This embodiment will accommodate various lengths of containment apparatus 100, which needs to be enclosed particularly between a cabinet 600 and moveable door 310, as seen in FIG. 2. The width of side blanking panels 400 can be adjusted, with this embodiment, to various widths, depending on the application. In another embodiment, side blanking panels 400 can be a flexible roller style panel or vertical projection screen, as shown in FIG. 5. In this example, the flexible roller panel has a sheet of impermeable, flexible material 430, that is rolled up in a roller 440, much like a window blind. The roller 440 is secured to the containment apparatus 100 and can be secured with screws and bolts or other common ways to secure such to one rail of a pair of upper rails 210 and to one rail of a pair of lower rails 200. The flexible material 430 spans between the lower tracks or rails 200 and upper tracks or rails 210 and can be unrolled or deployed from the roller 440 to a desired length to form a wall of the containment area 700. Roller 440 may be secured to one rail of a pair of upper rails 210 and to one rail of a pair of lower rails 200 by any number of conventional means such as by use of screws or bolts etc. As cabinets 600 are removed, more flexible material 430 can be unrolled to extend the length of the wall formed. As cabinets 600 are added, the flexible material 430 can be retracted onto roller 440 to shorten the length of the wall formed. Therefore, only one blanking panel 400 is required per side to help with any mismatch of cabinets 600 from side-to-side of the containment apparatus 100. Many common ways in the art for securing lead end 435 of flexible material 430 may be employed. In this embodiment, lead end 435 comprises a tab 437 which may engage a rail of a rack or a slot in a cabinet 600 so as to releasable secure flexible material 430 along a side of containment apparatus 100.

The bottom, sides, and ends of the containment area 700 are defined by the floor, cabinets 600, side blanking panels 400, and doors 300, 310. The top of containment area 700 is left open to allow the heated air in containment area 700 to flow into a ceiling plenum and to be directed to an air conditioning or other cooling unit. However, the ceiling portion 500 of containment apparatus 100 needs to be covered to prevent heated air directed into the ceiling plenum from circulating outside of the containment area 700 and mixing with the cooling air being supplied to the cabinets 600. Referring to FIGS. 6 and 7, ceiling 500 can be covered in a variety of ways. For example, as shown in FIG. 6, a plurality of individual ceiling blanking panels 510 can be placed over ceiling 500 and secured to a pair of upper tracks or rails 210. Blanking panels 510 can be installed using different types of attachment methods, such as magnets, screws, pushpins, hook and loop strips, etc. Alternatively, a flexible roller panel could also be used, such as that shown in FIG. 7. In this example, the flexible roller panel has a sheet of impermeable, flexible material 520, which is rolled up in a roller 530, much like a window blind. The roller 530 is secured to the containment system 100 such that the flexible material 520 spans between the two upper tracks 210 and can be unrolled or deployed from roller 530 to a desired length to cover ceiling portion 500. As the moveable door 310 is moved, flexible material 520 can be unrolled or retracted to match the length of the ceiling portion 500 between the moveable door 310 and the ends 550 of the pair of upper tracks or rails 210. The flexible material 520 can be rolled up using a spring loaded retraction mechanism, like a window shade, a motorized retraction mechanism, a manual handle 540, or any other well know means. Keeping the flexible material 520 taunt to the upper tracks 210 eliminates air leaks. The roller 530 can be secured to a pair of upper rails 210 by a number of conventional means such as with screws, bolts or the like.

Figure 8:
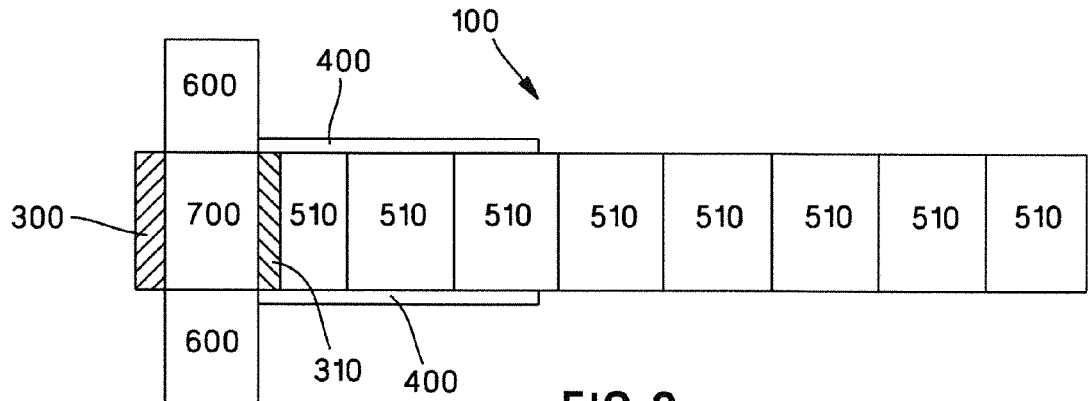
FIGS. 8-10 are top views of various examples of an adjustable containment apparatus with different numbers of cabinets installed.
Figure 9:
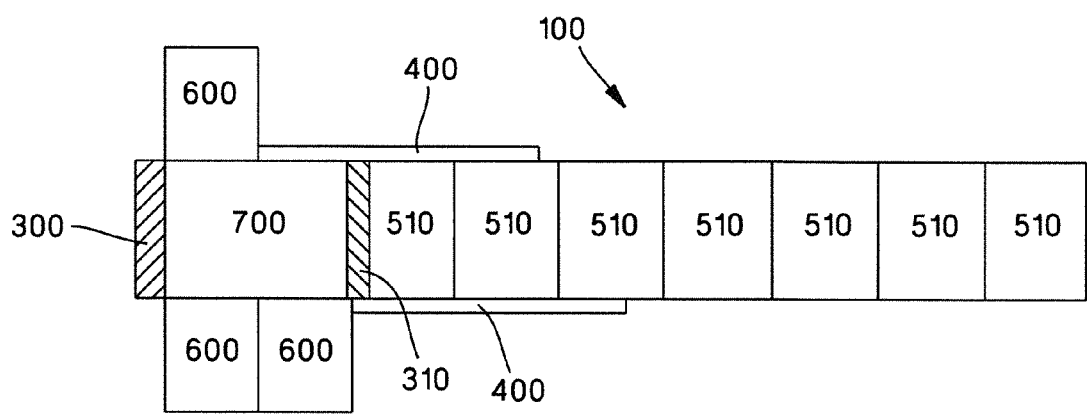

Each time a cabinet 600 is deployed into the containment apparatus 100, the moveable door 310 can be moved to accommodate the additional cabinet 600. The side blanking panels 400 can also be adjusted to close off the open sides of the containment area 700 between the fixed door 300 and the moveable door 310 and the individual ceiling blanking panels 510 or flexible material 520 can be removed or retracted to increase the opening for the heated air. Similarly, when a cabinet 600 is removed, the moveable door 310 can be moved to accommodate the loss of the cabinet 600. Side blanking panels 400 can then be adjusted to close off the open side of the area created by the removal of the cabinet and individual ceiling blanking panels 510 can be added or the flexible material 520 can be extended as needed. Therefore, the example containment system 100 shown accommodates the expected deployment differential of cabinets 600 per side of the containment apparatus 100. That makes it possible for the customer to deploy cabinets 600 on one side and nothing on the other side as shown in the various examples in FIGS. 8-10. As containment apparatus 100 is filled up with cabinets 600, depending on the type of blanking panel 400 used, the blanking panels 400 can be removed or cut down to the correct width required at the end of the line-ups or moved along the tracks to the required position. This eliminates the need for different size blanking panels 400. The ceiling can also be either individual blanking panels 510 or a flexible large opaque or translucent roll material 520 that can be retracted into a roller 530 at the end of the containment apparatus 100. Once the entire containment apparatus 100 is filled with cabinets 600, the ceiling panels 510 or flexible material 520 can be deployed to another containment apparatus 100 structure or stored for later use.

Referring to FIG. 11, one example of moveable door 310 is secured to the pair of upper rails 210 and can be moved along the upper rails 210, as shown by arrow A in FIG. 1. Moveable door 310 is moved to a predetermined distance from fixed door 300 and secured to the upper rails 210. The predetermined distance from door 300 will accommodate placing moveable door 310 adjacent the cabinet 600 positioned furthest from fixed door 300. This position defines one end of containment area 700. Moveable door 310, in this embodiment, comprises two panels 312 and 314 which are each hinged with hinges 315 to frame 316.

As shown in FIG. 11, upper rails 210 are positioned generally parallel to one another and lower rails 200 are also positioned generally parallel to one another. Also, as will be discussed in further detail below, upper rails 210 define a plurality of openings 212 positioned in and spaced apart along the length of each rail of the pair of upper rails 210. Openings 214 are also defined in and positioned spaced apart along the length of each rail of lower rails 200. These openings 212 and 214 are generally positioned in each of the pair of upper rails 210 and pair of lower rails 200.

Figure 12:
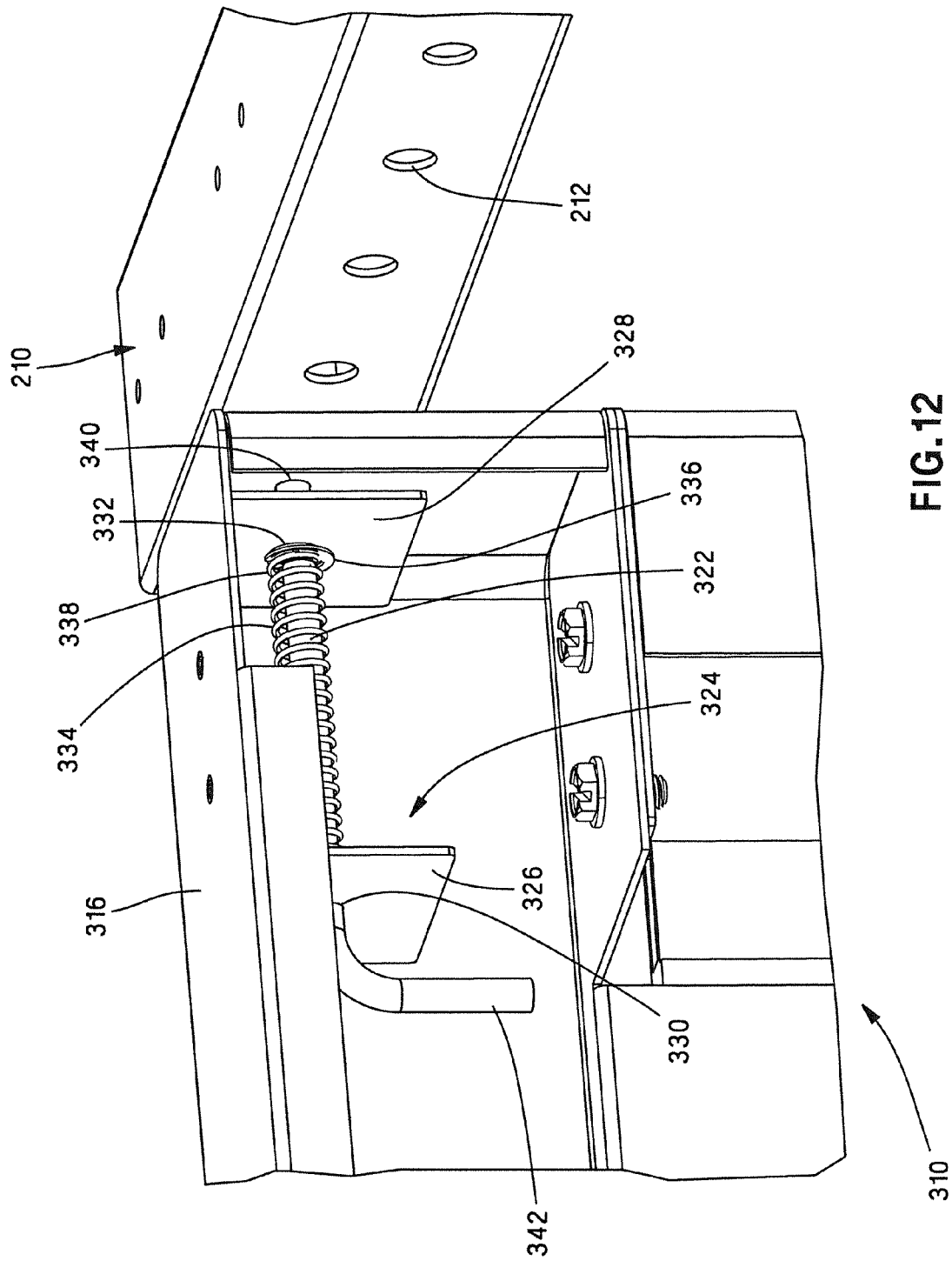
FIG. 12 is top corner perspective view as viewed from the inside of the containment apparatus of FIG. 11.

Referring to FIG. 12, pin 322 is mounted to the frame 316 and is moveable relative to the frame 316. Bracket 324 is secured to frame 316 with fasteners such as screws, rivets, bolts, welds or the like. Bracket 324 includes two spaced apart members 326 and 328, each defining an aperture 330 and 332 respectively. Pin 322 extends between the two spaced apart members 326 and 328 and through each aperture 330, 332. Each aperture is of a sufficient diameter to allow pin 322 to slide within apertures 330, 332. Spring 334 surrounds at least a portion of rod 322 positioned between the spaced apart members 326, 328. A retainer ring 336 is secured to pin 322 positioning retainer ring 336 between one end 338 of spring 334 and spaced apart member 328. End portion 340 of pin 322 extends in a direction away from spaced apart member 328.

Spring 334, as shown in FIG. 12, is in a relaxed condition and with end portion 340 of pin 322 positioned within opening 212 of one of the rails of the pair of upper rails 210. In this position moveable door 310 is secured to one rail of the pair of upper rails 210. Another such pin (not shown) mounted to and moveable relative to frame 316 is positioned spaced apart from pin 322 on an opposing side of frame 316 such that other pin engages an opening 212 on the other rail of the pair of upper rails 210.

To unsecure moveable door 310 from upper rails 210, the user will pull on handle 342 of pin 322 in a direction away from rail 210. Upon pulling on handle 342, retainer ring 336 compresses spring 334 and at the same time retracts end portion 340 of pin 322 out of opening 212. This can be done with the other pin positioned on the other side of moveable door 310 to disengage the moveable door 310 from the pair of upper rails 210. Moveable door 310 can be moved to the predetermined distance, as mentioned above, from fixed door 300 and with end portion 340 of pin 322 lined up with a desired opening 212, the user can release handle 342 and spring 334 will push against retainer ring 336 and move end portion 340 of pin 322 into the desired opening 212.

Figure 13:
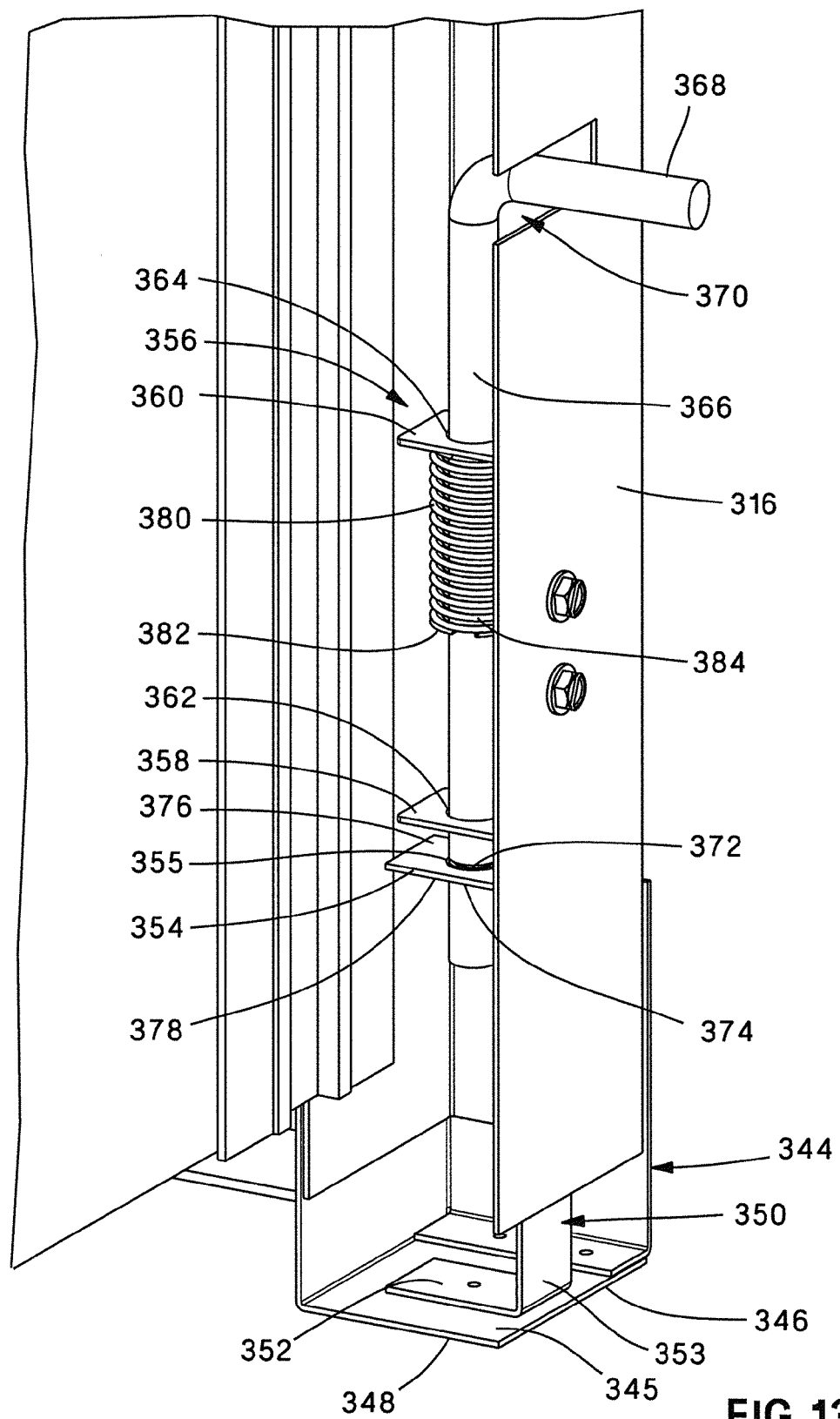
FIG. 13 is a bottom corner perspective view as viewed from the inside of the containment apparatus of FIG. 11 without showing a rail of the pair of the lower rails.

Referring now to FIG. 13, a portion of foot member 344 is positioned below frame 316 and provides support for frame 316 and moveable door 310 with respect to the floor or other surface upon which containment apparatus 100 rests. With door 310 secured to upper rails 210, foot member 344 is moveable relative to frame 316. Foot member 344 comprises a bottom member 345 with a bottom surface 346, which has a material 348 secured to surface 346. Surface 346 can be coated with a material 348 to enhance friction between surface 346 and the floor or other support structure. The coating or material 348 is constructed of a rubber coating or rubber padding.

Foot member 344 includes a first bracket 350 having one end member 352, which in this embodiment is a plate of the first bracket 350, secured to bottom member 345 by a conventional means of using a bolt, screw, rivet, weld or the like. Plate or one end member 352 is connected to and spaced apart from opposing end member or plate 354 by bracket arm 353. Opposing end member 354 defines an opening 355. Second bracket 356 is mounted to frame 316 by way of a screw, bolt, rivet, weld or the like. Second bracket 356 has opposing ends 358, 360, which are spaced apart plates that each define an opening 362, 364, respectively. Rod 366 extends through the opening defined in the opposing end 354 of the first bracket 350 and through the openings 362, 364 defined in the opposing ends 358, 360 of second bracket 356. End portion 368 of rod 366 extends generally in a direction transverse to rod 366. Frame 316 defines a notch 370 dimensioned to receive end portion 368 of the rod 366. A pair of retaining members 372, 374 are secured to rod 366 with retaining member 372 positioned on a top side 376 and another retaining member 374 positioned on the bottom side 378 of the opposing end member 354 of the first bracket 350. Spring 380 surrounds a portion of rod 366 positioned between the spaced apart opposing ends 358, 360 of second bracket 356. A spring retainer 382 is secured to rod 366 and positioned between one end 384 of spring 380 and one of the opposing ends 358 of second bracket 356. With end portion 368 of rod 366 positioned within notch 370 of frame 316, spring retainer 382 applies a compressive force onto spring 380 and one of the retainer members 374 positioned on the bottom side 378 of opposing end member 354 of first bracket 350 applies an upward force onto the bottom side 378 of opposing end member 354 of first bracket 350. In contrast, with end portion 368 of rod 366 positioned outside of notch 370, spring 380 exerts a force downward onto spring retainer 382 and a downward force is exerted by the other of the retaining members 374 positioned on the top side 376 of the opposing end member 354 of first bracket 350 onto the top side 376 of the opposing end member 376 of first bracket 350.

Using the retractable pin 322 arrangement as shown in FIG. 12 along with the foot member 344 arrangement shown in FIG. 13, moveable door 310 can be moved to a desired position along upper rails 210. In this process end portion 368 of rod 366 is positioned into notch 370 and pin 322 is positioned in upper part of frame 316 and engaged with an opening 212 in the pair of upper rails 210. With end portion 368 positioned in notch 370, foot member 344, which is positioned on opposing sides of the lower portion of frame 316, raises member 345 on either side of frame 316. At that point, frame 316 with moveable door 310 is suspended by pin 322 engaged into opening 212 on opposing sides of the upper portion of frame 316 thereby suspending frame 316 and moveable door 310 from upper rails 210. Pins 322 are pulled out from openings 212 of the pair of upper rails 210 freeing door 310 and frame 316 to be moved to a desired position along the pair of upper rails 210. With frame 316 and door 310 in the desired position, pins 322 on either side of upper portion of frame 316 are released and inserted into opening 212 on either side of frame 316, thereby securing frame 316 and door 310 to the upper rails 210. With the moveable door 310 suspended from upper rails 210, end portion 368 of foot members 344 positioned on opposing side of a lower portion of frame 316 is removed from notch 370, which results in spring 380 moving bottom member 345 in engagement with the floor and thereby securing frame 316 and moveable door 310 in a predetermined position relative to fixed door 300.

Figure 14:
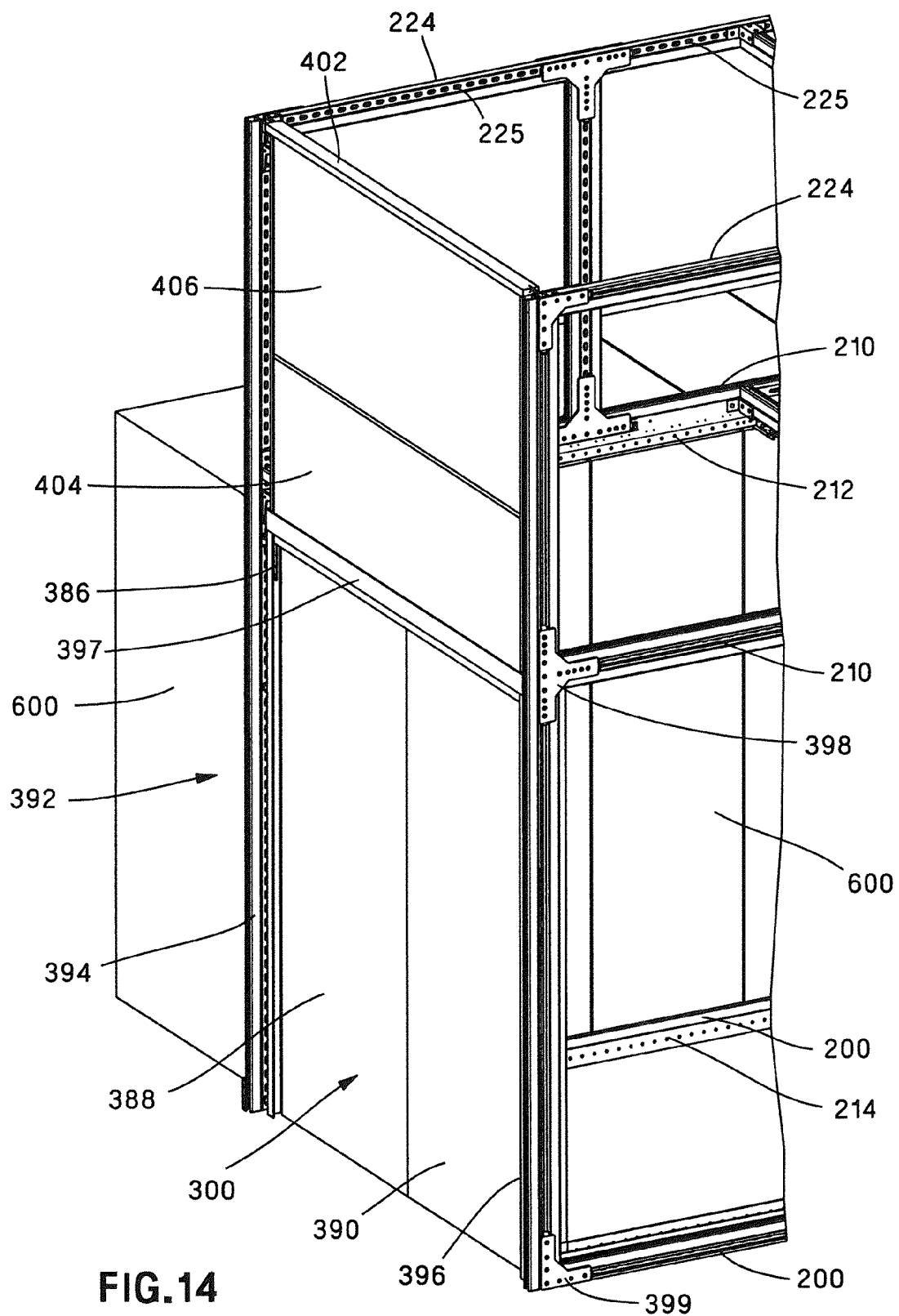
FIG. 14 is a perspective view of the fixed panel secured to the pair of upper rails and to the pair of lower rails of the containment apparatus and an adjustable above door panel.

Referring to FIG. 14, fixed panel or door 300 is secured to upper rails 210 and lower rails 200 utilizing hinges 386. Hinges 386 secure each panel 388, 390 of a two paneled door 300 to frame 392. The frame 392 includes two spaced apart members 394, 396 that extend in a vertical direction and are bracketed to the pair of upper rails 210 with brackets 398 and to the pair of lower rails 200 with brackets 399. In an instance where additional enclosure is needed above fixed door 300, the two spaced apart members 394, 396 can extend in a vertical direction above door 300 and cross member 397 which spans and interconnects spaced apart members 394, 396. A cross member 402 spans and interconnects spaced apart members 394, 396 and is spaced apart and above door 300 and cross member 397. At least two panels 404, 406 are positioned out of alignment with one another and both span between spaced apart members 394, 396. Each of panels 404, 406 are moveably secured to spaced apart members 394, 396 by conventional means such as inserting panels 404, 406 into channels defined in spaced apart members 394, 396 such as shown for channels shown in FIGS. 11A and 11B, which are defined in lower and upper rails 200 and 210. Panels 404, 406 will be able to slide independently of one another within these channels and can be moved, as seen in FIG. 14, to span between door 300 and cross member 402. Cross member 402 spans and interconnects with support structure rails 224 wherein support structure rails define openings and opposing ends of cross member 402 carry retractable spring loaded pins as described above in FIG. 12. These retractable pins provide ease in securement of cross member 402 to support structure rails 224. Conventional means can be used such as clips, spring loaded pins, as described herein, and the like to maintain panel 406 in position.

Figure 11A:
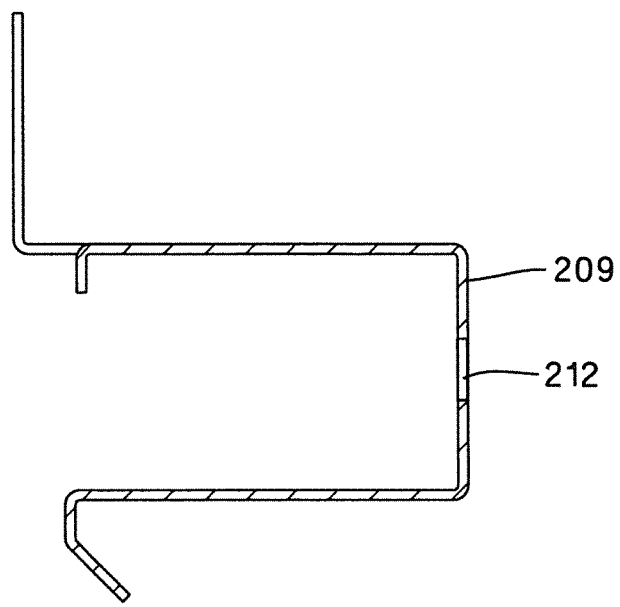
FIG. 11A is a cross section taken along line 11A-11A in FIG. 11.
Figure 11B:
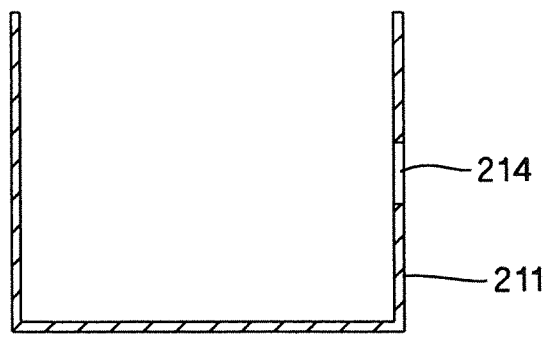
FIG. 11B is a cross section taken along line 11B-11B in FIG. 11.
Figure 15:
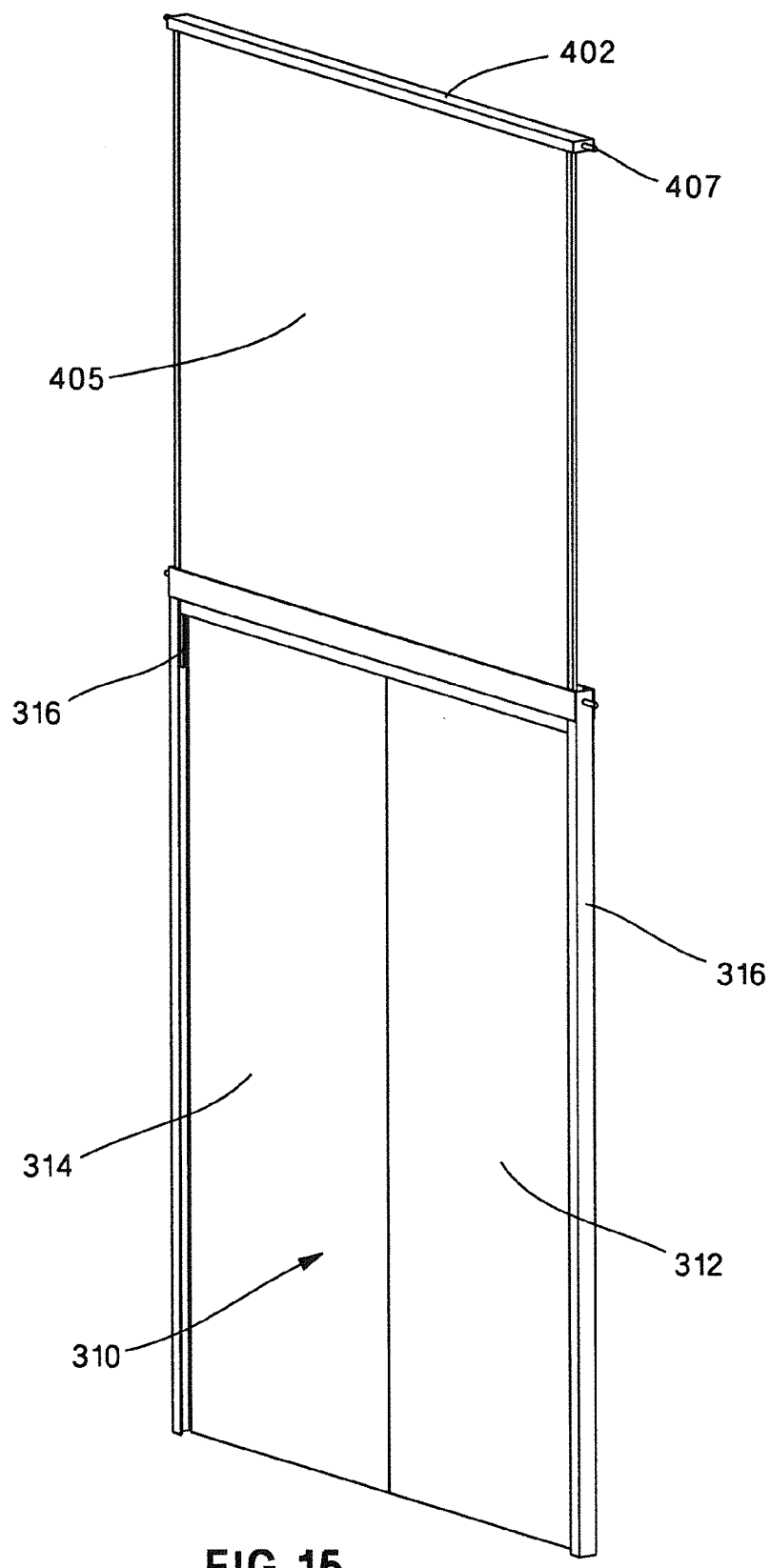
FIG. 15 is a perspective schematic view of a moveable door of FIG. 11 with an above door panel.

This arrangement of enclosing containment apparatus 100 above door 300 can also be done for moveable door 310. Referring to FIG. 15, in this embodiment panel 405 typically constructed of corrugated plastic or sheet metal is positioned above frame 316 and extends upwardly to create additional enclosure for containment apparatus 100. Cross member 402 provides support for panel 405 and can releasably be secured to opposing structural rails 224, such as seen in FIG. 14, with retractable pins 407. Retractable pins 407 can be constructed similar to pin 322, as shown in FIG. 12. Retractable pin 407 can be inserted into openings 225 of structural rails 224 such as seen in FIG. 14. Other embodiments for enclosing apparatus for above moveable door 310 can include telescoping above door arrangements as described above and shown in FIG. 14. Frame 316, of FIG. 15, can extend two spaced apart members 394, 396 such as seen in FIG. 14, above door 310 and they can be interconnected with cross member 402. Similarly, panels 404, 406, as shown in FIG. 14, can be positioned out of alignment with one another and both span between spaced apart members such as 394, 396. Each of the two panels 404, 406 are likewise moveably secured to spaced apart members 394, 396 by conventional means such as inserting panels 404, 406 into channels defined in spaced apart members 394, 396 such as shown in FIGS. 11A and 11B. Likewise panels 404, 406 will be able to slide independently of one another within these channels and can be moved to span between door 310 and cross member 402.

Figure 10:
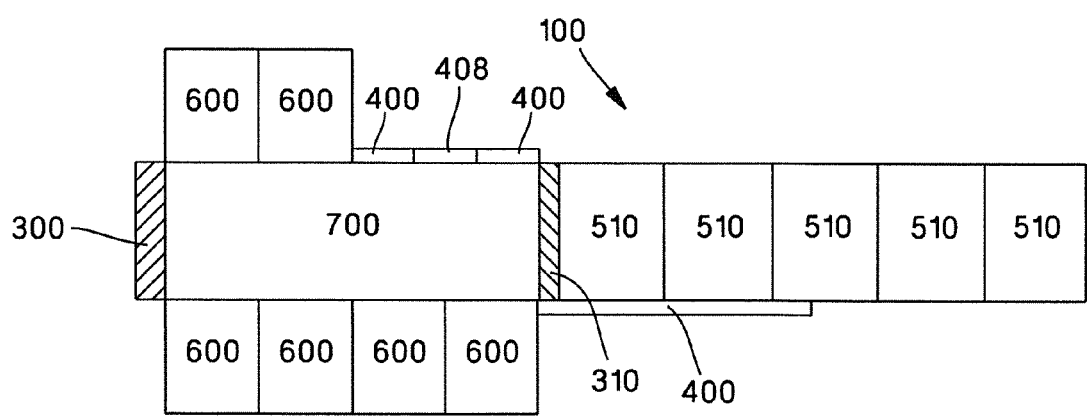
Figure 16:
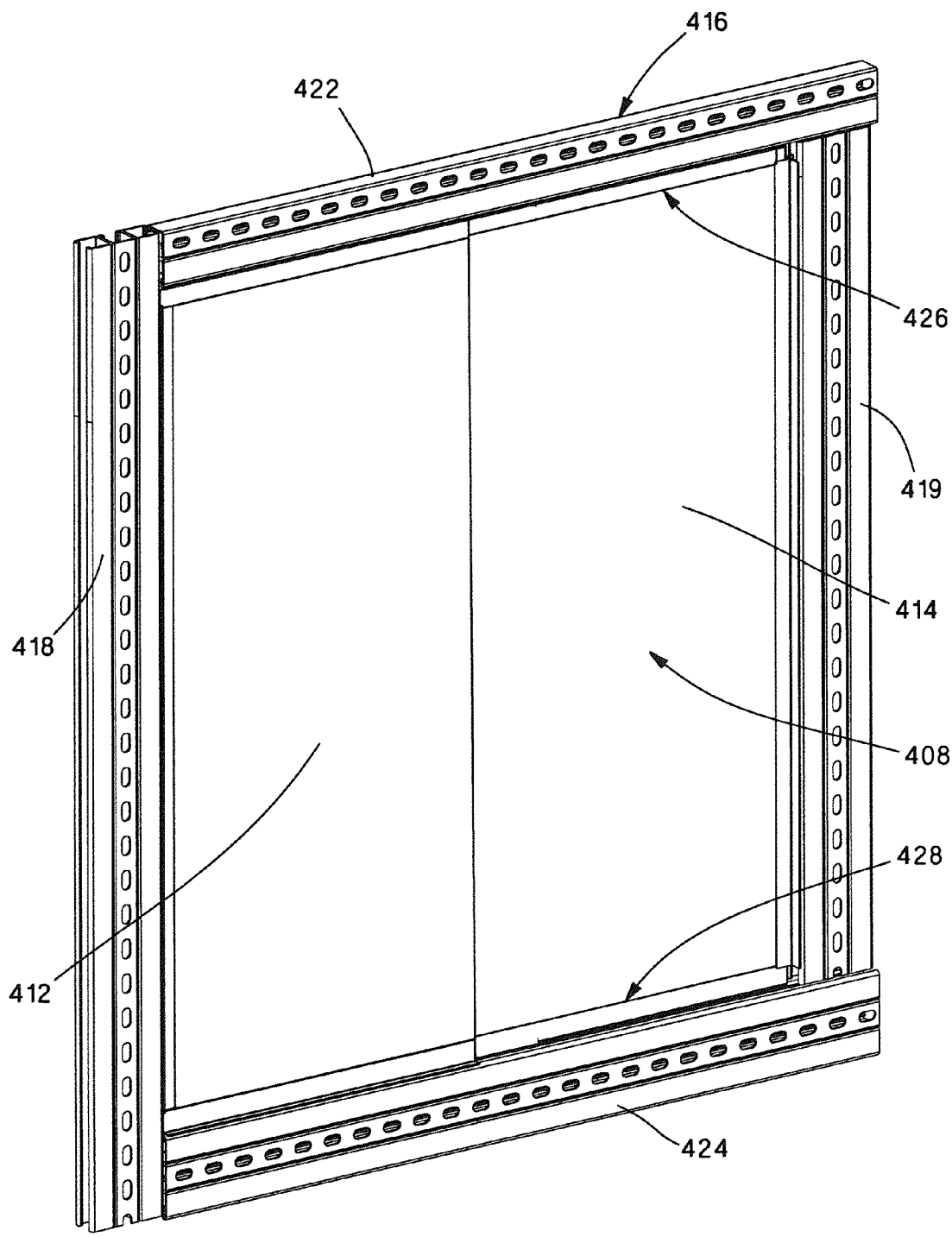
FIG. 16 is a perspective view of an example of a door of the containment apparatus.

Referring to FIG. 16, door 408 may be used with containment apparatus 100 for purposes of a moveable door 310 or even a fixed door 300. Additionally, this door 408 can be installed adjacent to and in the same plane with side blanking panel 400, as seen in FIG. 10, and provide yet a third route for someone to enter and leave containment area 700. This becomes particularly advantageous with containment apparatus 100 taking on a large number of cabinets 600 and thereby becoming a long structure. As will be understood, frame of door 408 can be inserted into channels shown for the upper pair of rails 210 and the pair of lower rails 200, as shown in FIGS. 11A and 11B, providing door securement to containment apparatus 100.

Door 408 includes two panels 412, 414 and a frame 416 supporting panels 412, 414. Frame 416 includes two side frame members 418, 419 spaced apart from one another, which extend in a vertical direction. In this embodiment, frame members 418, 419 are a triple strut member, as will be described in more detail here-in-below. Frame 416 also includes a top frame member 422 and a bottom frame member 424, which are spaced apart from one another and extend in a horizontal direction interconnecting with the two side frame members 418, 419. Frame 416 also includes a top channel 426, which extends along the top frame member 422, and a bottom channel 428, which extends along bottom frame member 424. Embodiments of these channels 426 and 428 are described in more detail below. Door 408 includes two panels 412, 414 that are positioned inside of channels 426, 428. The door panels 412, 414 will be sufficiently dimensioned such that use of both panels 412, 414 will span between two side frame members 418, 419. Thus, each panel 412, 414 will extend beyond half the distance between side frame members 418, 419 such that with panel 412 abutting side frame member 418 and panel 414 abutting side frame member 420, panels 412 and 414 overlap one another.

Referring to FIG. 17, frame member 424 includes three structural components 442, 444, 446 linked together. Each structural component 442-446 defines an opening 448, 450, 452, respectively. Each of these openings have lips 454 positioned on opposing sides of openings 448, 450, and 452. These openings are dimensioned to receive and hold flexible clip arms 456. Clip arms 456 insert into opening 448, in FIG. 17, and secure channel member 458 to frame member 424. Thus, channel member 458, for example, can be easily secured to frame member 424 by merely snapping clip arm members 456 into engagement with lips 454. As can be seen in FIG. 17, channel 458 is an embodiment of channel 428 set forth in FIG. 16. In this instance, channel 458 would be positioned on a right half or left half of frame member 424 of frame 416. Channel 464 of clip 462, as shown in FIG. 18, has channel 464 displaced in position relative to channel 458. As a result, channel 464 would be positioned on the other half of frame member 424, completing the channel 428 arrangement for bottom frame member 424. As can be appreciated, panels 412 and 414 can be inserted respectively into channel 458 and channel 464, each positioned on opposing half portions of frame member 424, which results in positioning panels 412 and 414 out of alignment with each other and permits ease in overlapping and sliding of the two panels 412, 414. Similarly, channels 458 and 464 can be positioned in top member 422 of frame 416 to correspond with and be aligned with channels 458 and 464 in bottom frame member 424. With this arrangement panel 412 inserted into channels 458 and panel 414 inserted into channels 464 will each move within its own plane and panels 412 and 414 will thereby move within adjacent and nonaligned planes. As can be appreciated channels 458 and 464 can be positioned on opposite side frame members 418 and 419 such that the channel is in alignment with the channels positioned adjacent to it in top and bottom frame members 424 and 426.

Referring to FIG. 19, clip 466 has opposing flexible clip arms 468, which can engage opposing lips 456, as seen in FIG. 17. Clip 466 may be inserted into side frame members 418 and 419 as well as in top frame member 422 and bottom frame member 424. In this embodiment, panels 412 and 414 will be positioned side by side within channel 470 adjacent to one another with each being able to independently slide along channel 470.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The invention claimed is:

1. An aisle containment apparatus, comprising:
   a pair of spaced apart upper rails;
   a pair of spaced apart lower rails positioned spaced apart from and below the pair of upper rails;
   a side blanking panel secured to one of the pair of upper rails and to one of the pair of lower rails;
   a ceiling extending between the pair of upper rails;
   a fixed panel secured to the pair of upper rails and to the pair of lower rails;
   a moveable panel releasably secured to the pair of upper rails and adjustably positioned along the pair of upper rails so as to position the moveable panel a predetermined distance from the fixed panel;
   a door positioned adjacent to and extending generally in the same plane of the side blanking panel;
   a frame comprising two spaced apart members, wherein each member extends in a vertical direction above the door;
   a cross member interconnected to the two spaced apart members and spaced above the door; and
   at least two panels positioned out of alignment with each other, the at least two panels spanning between and moveably secured to the two spaced apart members, wherein each panel is dimensioned to permit both panels to span from a position between the door and the cross member.

2. The aisle containment apparatus of claim 1, wherein the side blanking panel comprises two panels positioned out of alignment with one another and each are movably secured to one of the pair of upper rails and one of the pair of lower rails such that each panel of the two panels are independently movable.

3. The aisle containment apparatus of claim 1, wherein the side blanking panel comprises a sheet of flexible material which spans between one of the pair of upper rails and one of the pair of lower rails, wherein the sheet of flexible material is deployed from a roller associated with the one of the pair of upper rails and the one of the pair of lower rails.

4. The aisle containment apparatus of claim 1, wherein the ceiling extends in a direction from the moveable panel to ends of the pair of upper railings.

5. The aisle containment apparatus of claim 4, wherein the ceiling comprises at least one ceiling blanking panel secured to the pair of upper rails.

6. The aisle containment apparatus of claim 4, wherein the ceiling portion comprises a flexible sheet of material which spans between the pair of upper rails and the sheet of flexible material is positioned along the pair of the upper rails and deployed from a roller associated with the pair of upper rails.

7. The containment apparatus of claim 1, wherein the pair of upper rails are positioned generally parallel to one another and the pair of lower rails are positioned generally parallel to one another.

8. The containment apparatus of claim 1, wherein each rail of the pair of upper rails defines openings in and positioned along a length of each rail.

9. The containment apparatus of claim 8, wherein at least one of the fixed panel and the moveable panel comprises a door.

10. The containment apparatus of claim 9, further comprising a frame that supports the door.

11. The containment apparatus of claim 10, wherein the frame comprises:
two side frame members spaced apart from one another and extending in a vertical direction, a top frame member including a top channel, and a bottom frame member including a bottom channel, spaced apart from the top frame member, and extending in a horizontal direction interconnecting with the two side frame members; and
two door panels positioned within the top and bottom channels, wherein the dimension of each of the two door panels, in a direction that spans between the two side frame members, each extend beyond half the distance between the two side frame members and with the one of the two door panels abutting one of the side frame members and the other of the two door panels abutting the other of the side frame members, the two door panels overlap.

12. An aisle containment apparatus, comprising:
a pair of spaced apart upper rails;
a pair of spaced apart lower rails positioned spaced apart from and below the pair of upper rails;
a side blanking panel secured to one of the pair of upper rails and to one of the pair of lower rails;
a ceiling extending between the pair of upper rails;
a fixed panel secured to the pair of upper rails and to the pair of lower rails;
a moveable panel releasably secured to the pair of upper rails and adjustably positioned along the pair of upper rails so as to position the moveable panel a predetermined distance from the fixed panel, wherein each rail of the pair of upper rails defines openings in and positioned along a length of each rail, wherein at least one of the fixed panel and the moveable panel comprises a door;
a frame that supports the door;
a pin mounted to the frame and moveable relative to the frame;
a bracket secured to the frame, the bracket comprising two spaced apart members, wherein each member defines an aperture with the pin extending between the spaced apart members and moveable through the aperture of each member;
a spring surrounding at least a portion of the pin positioned between the two spaced apart members; and
a retaining ring secured to the pin and positioned between one end of the spring and one of the spaced apart members with an end portion of the pin extending in a direction away from the one of the two spaced apart members.

13. An aisle containment apparatus, comprising:
a pair of spaced apart upper rails;
a pair of spaced apart lower rails positioned spaced apart from and below the pair of upper rails;
a side blanking panel secured to one of the pair of upper rails and to one of the pair of lower rails;
a ceiling extending between the pair of upper rails;
a fixed panel secured to the pair of upper rails and to the pair of lower rails;
a moveable panel releasably secured to the pair of upper rails and adjustably positioned along the pair of upper rails so as to position the moveable panel a predetermined distance from the fixed panel, wherein each rail of the pair of upper rails defines openings in and positioned along a length of each rail, wherein at least one of the fixed panel and the moveable panel comprises a door;
a frame that supports the door; and
a foot member wherein a portion of the foot member is positioned below the frame and is moveable relative to the frame.

14. An aisle containment apparatus, comprising:
a pair of spaced apart upper rails;
a pair of spaced apart lower rails positioned spaced apart from and below the pair of upper rails;
a side blanking panel secured to one of the pair of upper rails and to one of the pair of lower rails;
a ceiling extending between the pair of upper rails;
a fixed panel secured to the pair of upper rails and to the pair of lower rails;
a moveable panel releasably secured to the pair of upper rails and adjustably positioned along the pair of upper rails so as to position the moveable panel a predetermined distance from the fixed panel, wherein each rail of the pair of upper rails defines openings in and positioned along a length of each rail, wherein at least one of the fixed panel and the moveable panel comprises a door;
a frame that supports the door;
two spaced apart members secured to the frame and extending in a vertical direction above the door;
a cross member interconnected to the two spaced apart members and spaced above the door; and
at least two panels positioned out of alignment with each other, the at least two panels spanning between and moveably secured to the two spaced apart members, wherein each panel is dimensioned to permit both panels to span from a position between the door and the cross member.

15. The containment apparatus of claim 12, further comprising another pin mounted to the frame and moveable relative to the frame and positioned spaced apart from the pin.

16. The containment apparatus of claim 13, wherein the foot member comprises a bottom member comprising a bottom surface in which a material different from the material from which the foot member is constructed is secured to the bottom surface.

17. The containment apparatus of claim 16, wherein the foot member comprises:
a first bracket, wherein one end member of the first bracket is secured to the bottom member and an opposing end member of the bracket member defines an opening;
a second bracket mounted to the frame, spaced apart opposing ends of the second bracket each defines an opening;
a rod extending through the opening defined in the opposing end member of the first bracket and through the openings defined in the opposing ends of the second bracket, wherein an end portion of the rod extends generally in a direction transverse to the rod and the frame defines a notch dimensioned to receive the end portion of the rod;
a pair of retaining members secured to the rod with a retaining member positioned on a top side and another retaining member positioned on the bottom side of the opposing end member of the first bracket;
a spring surrounding a portion of the rod positioned between the spaced apart opposing ends of the second bracket;
a spring retainer secured to the rod and positioned between one end of the spring and one of the opposing end members of the second bracket; wherein
the spring retainer applies a compressive force onto the spring and the one of the retainer members positioned on the bottom side of the opposing end members of the first bracket applies an upward force onto the bottom side of the opposing end member of the first bracket with the end portion of the rod positioned within the notch of the frame; and the spring exerts a force downward onto the spring retainer and a downward force is exerted by the other of the retaining members positioned on the top side of the opposing end member of the first bracket onto the top side of the opposing end member of the first bracket with the end of the rod positioned outside of the notch.

* * * * *